(12) United States Patent
Scarsbrook et al.

(10) Patent No.: US 8,501,143 B2
(45) Date of Patent: *Aug. 6, 2013

(54) SINGLE CRYSTAL DIAMOND PREPARED BY CVD

(75) Inventors: Geoffrey Alan Scarsbrook, Berkshire (GB); Philip Maurice Martineau, Berkshire (GB); John Lloyd Collins, London (GB); Ricardo Simon Sussmann, Berkshire (GB); Bärbel Susanne Charlotte Dorn, Berkshire (GB); Andrew John Whitehead, Surrey (GB); Daniel James Twitchen, Berkshire (GB)

(73) Assignee: Element Six Ltd., Ballasalla (IM)

( * ) Notice: Subject to any disclaimer, the term of this patent is extended or adjusted under 35 U.S.C. 154(b) by 637 days.

This patent is subject to a terminal disclaimer.

(21) Appl. No.: 12/245,002

(22) Filed: Oct. 3, 2008

(65) Prior Publication Data

US 2009/0175777 A1 Jul. 9, 2009

Related U.S. Application Data

(63) Continuation of application No. 10/777,633, filed on Feb. 13, 2004, now abandoned, which is a continuation of application No. 10/311,215, filed as application No. PCT/IB01/01037 on Jun. 14, 2001, now abandoned.

(30) Foreign Application Priority Data

Jun. 15, 2000 (GB) .................................... 0014693.6
Mar. 20, 2001 (GB) .................................... 0106930.1

(51) Int. Cl.
*B01J 3/06* (2006.01)
*B32B 9/00* (2006.01)
*B32B 17/10* (2006.01)
*C30B 23/00* (2006.01)
*C30B 25/00* (2006.01)
*C30B 28/14* (2006.01)
*H05H 1/24* (2006.01)

(52) U.S. Cl.
USPC ............. 423/446; 428/408; 428/334; 117/97; 117/929; 117/84; 117/88; 117/94; 427/577

(58) Field of Classification Search
None
See application file for complete search history.

(56) References Cited

U.S. PATENT DOCUMENTS 5,328,855 A 7/1994 Kitabatake et al.
5,391,409 A 2/1995 Shibata et al.
(Continued)

FOREIGN PATENT DOCUMENTS

EP 0 316 856 A1 5/1989
EP 0 421 397 A1 4/1991
(Continued)

OTHER PUBLICATIONS

Salvatori et al.; Minority-Carrier Transport Parameters in CVD Diamond; Carbon 37; 811-816; 1999.*

(Continued)

*Primary Examiner* — Melvin C Mayes
*Assistant Examiner* — Guinever Gregorio
(74) *Attorney, Agent, or Firm* — Oblon, Spivak, McClelland, Maier & Neustadt, L.L.P.

(57) ABSTRACT

A single crystal diamond prepared by CVD and having one or more electronic characteristics; making the diamond suitable for electronic applications. Also provided is a method of making the single crystal CVD diamond.

33 Claims, 5 Drawing Sheets

(56) References Cited

U.S. PATENT DOCUMENTS

| | | | |
|---|---|---|---|
| 5,443,032 | A | 8/1995 | Vichr et al. |
| 5,614,019 | A | 3/1997 | Vichr et al. |
| 5,803,967 | A | 9/1998 | Plano et al. |
| 5,981,057 | A | 11/1999 | Collins |
| 7,128,974 | B2 | 10/2006 | Scarsbrook et al. |
| 7,160,617 | B2 | 1/2007 | Scarsbrook et al. |
| 7,172,655 | B2 | 2/2007 | Twitchen et al. |
| 7,368,723 | B2 * | 5/2008 | Whitehead et al. ...... 250/370.01 |
| 2004/0175499 | A1 | 9/2004 | Twitchen et al. |
| 2004/0177803 | A1 | 9/2004 | Scarsbrook et al. |
| 2004/0180205 | A1 | 9/2004 | Scarsbrook et al. |
| 2004/0194690 | A1 | 10/2004 | Twitchen et al. |
| 2004/0221795 | A1 | 11/2004 | Scarsbrook et al. |
| 2004/0229464 | A1 | 11/2004 | Godfried et al. |
| 2007/0036921 | A1 | 2/2007 | Twitchen et al. |
| 2007/0079752 | A1 | 4/2007 | Twitchen et al. |
| 2007/0092647 | A1 | 4/2007 | Scarsbrook et al. |
| 2007/0148079 | A1 | 6/2007 | Scarsbrook et al. |
| 2007/0148374 | A1 | 6/2007 | Twitchen et al. |
| 2007/0212543 | A1 | 9/2007 | Twitchen et al. |
| 2008/0044339 | A1 | 2/2008 | Scarsbrook et al. |
| 2008/0085233 | A1 | 4/2008 | Scarsbrook et al. |

FOREIGN PATENT DOCUMENTS

| | | |
|---|---|---|
| EP | 0 507 497 | 10/1992 |
| EP | 0 573 943 A1 | 12/1993 |
| EP | 0 582 397 | 2/1994 |
| EP | 0 589 464 A1 | 3/1994 |
| EP | 0 615 954 A1 | 9/1994 |
| EP | 0 635 584 | 1/1995 |
| EP | 0 688 026 A1 | 12/1995 |
| EP | 0 715 885 A2 | 6/1996 |
| EP | 0 745 707 A1 | 12/1996 |
| EP | 0 918 100 | 5/1999 |
| JP | 1-131014 | 5/1989 |
| JP | 2-107596 | 4/1990 |
| JP | 6-107494 | 4/1994 |
| JP | 6-183892 | 7/1994 |
| JP | 6-263418 | 9/1994 |
| JP | 7-277890 | 10/1995 |
| JP | 8-130102 | 5/1996 |
| JP | 9-165295 | 6/1997 |
| JP | 10 236899 | 9/1998 |
| JP | 11-1392 | 1/1999 |
| WO | 99-64892 | 12/1999 |

OTHER PUBLICATIONS

P. Kania, et al., Diamond and Related Materials, vol. 4, pp. 425-428 (1995).
English translation of "Characterization of thick homoepitaxial film on diamond (001) substrate II".
English translation of "Homoepitaxial growth of diamond (001) with nitrogen doping".
J. Michler, et al., J. Appl. Phys., vol. 83, No. 1, pp. 187-197 (1998).
R. Locher, et al., Appl. Phys. Lett., vol. 65, No. 1, pp. 34-36 (1994).
I.I. Vlasov, et al., Phys. Stat. Sol, vol. (a)181, No. 83, pp. 83-90 (2000).
P.E. Pehrsson, et al., Mat. Res. Soc. Symp, Proc., vol. 416, pp. 51-56 (1996).
R. Samlenski, et al., "Incorporation of nitrogen in chemical vapor deposition diamond", Applied Physics Letters, vol. 67, No. 19, pp. 2798-2800.
Reggianai, et al., "Hole-drift velocity in natural diamond", Physical Review B., vol. 23, No. 6, pp. 3050-3057 (1981).
Marinelli, et al., Applied Physics, vol. 75, No. 20, pp. 3216-3218 (1999) (American Institute of Physics).
Yoneda, et al., Applied Physics Letters, vol. 66, No. 4, pp. 460-462 (1995).
U.S. Appl. No. 11/917,908, filed Dec. 18, 2007, Williams, et al.
S. Thomas, et al., "Homoepitaxial diamond film deposition on a brilliant cut diamond anvil", American Institute of Physics, 1995, 2 pages.

* cited by examiner

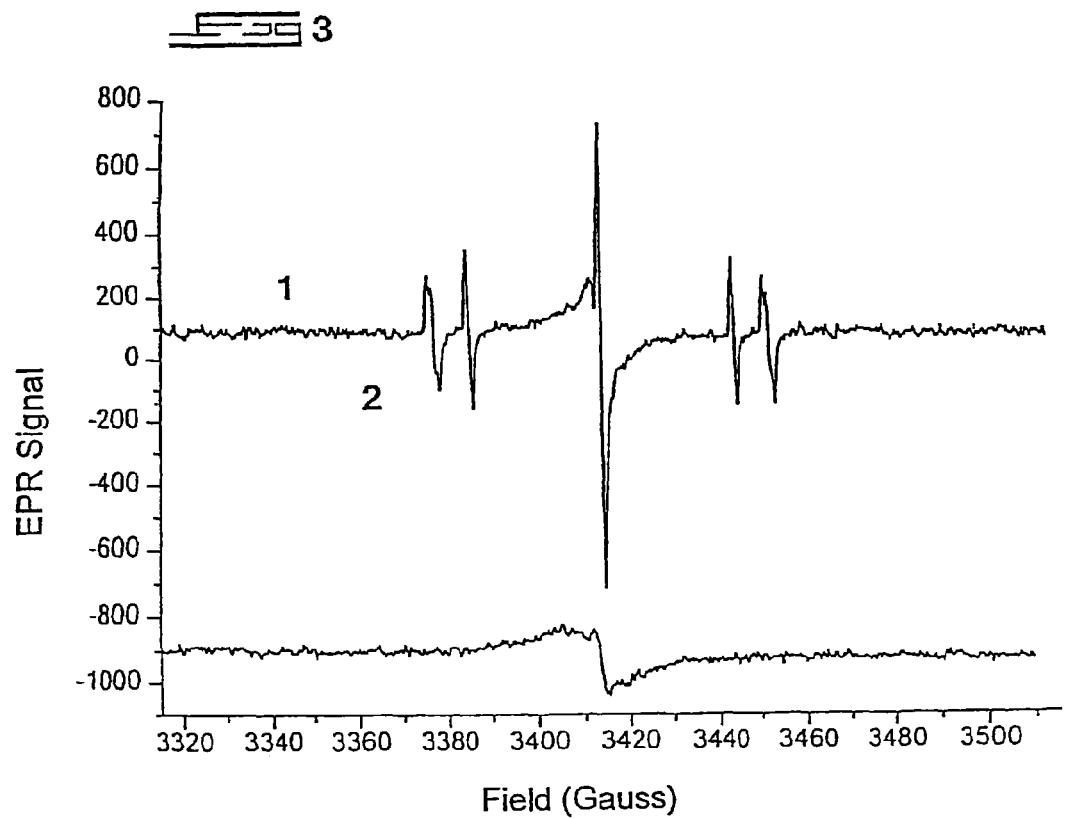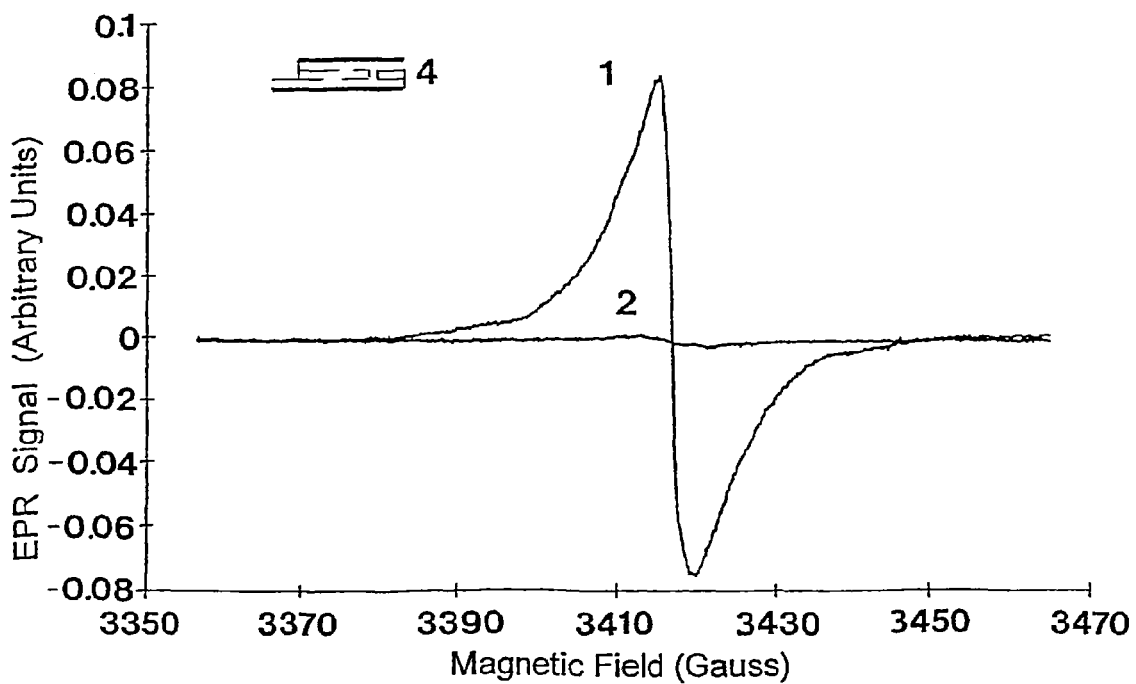

SINGLE CRYSTAL DIAMOND PREPARED BY CVD

RELATED APPLICATIONS

This application is a continuation of application Ser. No. 10/777,633 filed on Feb. 13, 2004, now abandoned, which is incorporated by reference in its entirety for all useful purposes. Application Ser. No. 10/777,633 is a continuation of application Ser. No. 10/311,215 filed on Dec. 16, 2002, now abandoned, which is incorporated by reference in its entirety for all useful purposes. Application Ser. No. 10/311,215 is a national stage application (under 35 U.S.C. §371) of PCT/IB01/01037 filed Jun. 14, 2001, which claims benefit of UK application 0106930.1 filed Mar. 20, 2001 UK application 0014693.6 filed Jun. 15, 2000.

BACKGROUND OF THE INVENTION

This invention relates to diamond and more particularly to diamond produced by chemical vapour deposition (hereinafter referred to as CVD).

Methods of depositing materials such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F, Cl) in atomic form and C or carbon-containing radicals and other reactive species, e.g. $CH_x$, $CF_x$ wherein x can be 1 to 4. In addition, oxygen containing sources may be present, as may sources for nitrogen and for boron. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ (Hal=halogen) wherein x and z can each be 1 to 10 and y can be 0 to 10 and optionally one or more of the following: COX, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF energy, a flame, a hot filament or a jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced. The production of homoepitaxial CVD diamond layers has been reported in the literature.

European Patent Publication No. 0 582 397 describes a method of producing a polycrystalline CVD diamond film having an average grain size of at least 7 microns and a resistivity, carrier mobility and carrier lifetime yielding a collection distance of at least 10 μm at an electric field strength of 10 kV/cm. This is a diamond film of a quality which makes it suitable for use as a radiation detector. However, applications for films having collection distances as low as 7 μm are very limited.

European Patent Publication No. 0 635 584 describes a method of producing a CVD polycrystalline diamond film using an arc jet process with low methane levels (less than 0.07%) and an oxidant. The diamond material has a narrow Raman peak, a relatively large lattice constant, and a charge carrier collection distance of greater than 25 μm. However, the performance of polycrystalline diamond films in electronic applications is believed to be adversely affected by the presence of grain boundaries.

It has not previously been reported that single crystal CVD diamond can be grown with sufficient control to achieve high performance detector material. Collection distances measured on natural single crystal diamond have been reported of about 28 μm at 10 kV/cm and 60 μm at bias voltages of 26 kV/cm. In high quality type IIa natural single crystal diamond the collection distance has been shown to vary nearly linearly with bias voltage up to 25 kV/cm, unlike polycrystalline material which typically shows saturation of the collection distance at about 10 kV/cm.

The collection distance can be adversely affected in a single crystal diamond by the presence of impurities and lattice defects which reduce the free carrier mobility and free carrier recombination lifetime of the carrier.

Prior art has generally concerned itself with the thermal, optical and mechanical properties of CVD diamond.

SUMMARY OF THE INVENTION

According to a first aspect of the invention, there is provided a single crystal diamond prepared by CVD and having at least one of the following characteristics:

(i) in the off state, a resistivity $R_1$ greater than $1 \times 10^{12}$ Ωcm, and preferably greater than $2 \times 10^{13}$ Ωcm, and more preferably greater than $5 \times 10^{14}$ Ωcm, all measured at an applied field of 50 V/μm and 300 K (or 20° C., which for the purposes of this invention is considered equivalent)

(ii) a high breakdown voltage in the off state, and high current with long carrier life time in the on state and, more particularly, a μτ product greater than $1.5 \times 10^{-6}$ cm²/V, and preferably greater than $4.0 \times 10^{-6}$ cm²/V, and more preferably greater than $6.0 \times 10^{-6}$ cm²/V, all measured at an applied field of 50 V/μm and 300 K. μ is the mobility and τ is the lifetime of the charge carriers, the product representing the contribution by a charge carrier to the total charge displacement or current. This characteristic can also be measured and expressed as a charge collection distance;

(iii) an electron mobility ($\mu_e$) measured at 300K greater than 2400 cm² V⁻¹ s⁻¹, and preferably greater than 3000 cm² V⁻¹ s⁻¹, and more preferably greater than 4000 cm² V⁻¹ s⁻¹. In high quality type IIa natural diamond electron mobilities, at 300 K, are reported to be typically 1800 cm² V⁻¹ s⁻¹ with exceptional values reported up to 2200 cm² V⁻¹ s⁻¹;

(iv) a hole mobility ($\mu_h$) measured at 300 K greater than 2100 cm² V⁻¹ s⁻¹; and preferably greater than 2500 cm² V⁻¹ s⁻¹, and more preferably greater than 3000 cm² V⁻¹ s⁻¹. In high quality type IIa natural diamond, hole mobilities at 300 K are reported to be typically 1200 cm² V⁻¹ s⁻¹ with exceptional values reported up to 1900 cm² V⁻¹ s⁻¹;

(v) a high charge collection distance greater than 150 μm, and preferably at least 400 μm, and more preferably at least 600 μm, all collection distances being measured at an applied field of 1 V/μm and 300 K. In high quality type IIa natural diamond, charge collection distances are reported to be substantially less than 100 μm, and more typically about 40 μm at 300 K and an applied field of 1 V/μm.

In a wide band gap device such as one fabricated from diamond, the number of free charge carriers present under equilibrium conditions is extremely small and dominated by the contribution from lattice defects and impurities; such a device is said to be in the "off state". The device can be put into the "on state" by the additional excitation of charge carriers by means such as optical excitation (primarily using optical energies near or greater than the band gap) or by charged particle excitation (e.g. alpha or beta particles). In the on state the free carrier density exceeds the equilibrium level and when the excitation source is removed the device will revert to the off state.

It will be noted from the above that the diamond of the invention has electronic characteristics which are substantially greater than those present in natural high quality diamond. This is surprising and provides the diamond with properties which are useful, for example, for electronic applications and for detectors.

The single crystal CVD diamond of the invention is of high chemical purity and is substantially free of crystal defects.

a) Resistivity

Thus, the single crystal CVD diamond of the invention may, in one form of the invention, have, in the off state, a high resistivity at high applied fields and more particularly a resistivity $R_1$ greater than $1 \times 10^{12}$ Ωcm, and preferably greater than $2 \times 10^{13}$ Ωcm and more preferably greater than $5 \times 10^{14}$ Ωcm, at an applied field of 50 V/μm measured at 300 K. Such resistivities at such high applied fields are indicative of the purity of the diamond and the substantial absence of impurities and defects. Material of lower purity or crystal perfection can exhibit high resistivity at lower applied fields, e.g. less than 30 V/μm, but shows breakdown behaviour with rapidly rising leakage currents at applied fields greater than 30 V/μm and generally by 45 V/μm. The resistivity can be determined from a measurement of the leakage (dark) current by methods known in the art. A sample under test is prepared as a plate of uniform thickness, cleaned using standard diamond cleaning techniques in order to accept suitable contacts (evaporated, sputtered or doped diamond) to which external connections can be made to the voltage supply, and then partially or wholly encapsulated to avoid risk of flash-over. It is important to ensure that the encapsulation does not add significantly to the leakage current measured.

Typical sample sizes are 0.01-0.5 mm thick by 3×3 mm-50×50 mm laterally, but smaller or larger sizes may also be used.

b) μτ Product

The single crystal CVD diamond of the invention may have a μτ product greater than $1.5 \times 10$ cm$^2$/V, preferably a μτ product of greater than $4.0 \times 10^{-6}$ cm$^2$/V and more preferably a μτ product greater than $6.0 \times 10^6$ cm$^2$/V, all measurements at 300 K. The μτ product is related to the charge collection distance using the following equation:

$$\mu\tau E = CCD$$

$$(cm^2/Vs) \times (s) \times (V/cm) = cm$$

where E=applied field

The single crystal CVD diamond of the invention, particularly in its preferred form, has a high μτ product which translates into a high charge collection distance, much higher than has been achieved with any other known single crystal CVD diamond.

When an electric field is applied to a sample using electrodes it is possible to separate the electron-hole pairs generated by photon irradiation of the sample. The holes drift toward the cathode and the electrons toward the anode. Light with a short wavelength (ultraviolet or UV light) and a photon energy above the bandgap of the diamond has a very small penetration depth into diamond and by using this type of light it is possible to identify the contribution of one type of carrier only dependent on which electrode is illuminated.

The μτ product referred to in this specification is measured in the following way:
(i) A sample of diamond is prepared as a plate in excess of 100 μm thick.
(ii) Ti semi-transparent contacts are sputtered onto both sides of the diamond plate and then patterned using standard photolithography techniques. This process forms suitable contacts.
(iii) A 10 μs pulse of monochromatic Xe light (wavelength 218 nm) is used to excite carriers, with the photocurrent generated being measured in an external circuit. The pulse length of 10 μs is far longer than other processes such as the transit time and the carrier lifetime and the system can be considered to be in equilibrium at all times during the pulse. The penetration of light into the diamond at this wavelength is only a few microns. Relatively low light intensity is used (about 0.1 W/cm$^2$), so that $N_0$ is relatively low and the internal field is then reasonably approximated by the applied field. The applied field is kept below the threshold above which mobility becomes field dependent. The applied field is also kept below the value above which a significant proportion of the charge carriers reach the far side of the diamond and the total charge collected shows saturation (with blocking contacts; non-blocking contacts can show gain at this point).
(iv) The μτ product is derived by relating the collected charge to the applied voltage using the Hecht relation.

$$Q = N_0 e \mu \tau E/D[1-\exp\{-D/(\mu\tau E)\}]$$

In this equation Q is the charge collected at the non-illuminated contact, $N_0$ the total number of electron hole pairs generated by the light pulse, E the applied electric field, D the sample thickness, and μτ is the mobility and lifetime product to be determined.
(v) As an example, if the illuminated electrode is the anode (cathode), then the charge carriers are generated within a few μm of the surface, and the charge displacement of the electrons (holes) to the nearby electrode is negligible. In contrast, the charge displacement of the holes (electrons) towards the opposing contact is significant, and limited by the μτ product, where both μ and τ are specific to the particular charge carriers moving towards the non-irradiated electrode.

c) High Collection Distance

The single crystal CVD diamond of the invention will have a high collection distance and typically a collection distance of greater than 150 μm, preferably greater than 400 μm and more preferably greater than 600 μm, all distances being at 1V/μm applied field and 300 K.

Collection distance and its determination are known in the art. Radiation such as UV, X-rays and gamma rays impinging on diamond can form electron hole pairs which drift under an applied voltage between electrodes. Typically, for penetrating radiation such as beta and gamma rays the electrodes are placed on opposite surfaces of a diamond layer whose thickness is typically 200-700 μm but can range from less than 100 μm to greater than 1000 μm and the charge carriers (electrons/holes) drift through the thickness of the layer. For highly absorbed radiation which penetrates only a few μm into the diamond, such as alpha radiation or UV radiation with energies near or above that of the band gap, then inter-digitated electrode arrangements on the same face of the diamond layer may be used; this face may be planar or with the electrodes placed in relationship to surface structures such as grooves.

However, the electrons and holes have finite mobilities and lifetimes so they move only a certain distance before recombining. When an event occurs (e.g. impingement of a beta particle) which forms charge carriers, then to first order the total signal from the detector depends on the average distance moved by the charge carriers. This charge displacement is a product of the carrier mobility and the applied electric field (which gives the charge drift velocity) and the recombination lifetime of the carriers before trapping or recombination stops its drift. This is the collection distance, which can also be considered as the volume of charge swept to the electrode. The purer the diamond (or the lower the level of uncompensated traps) or the lower the level of crystalline imperfections, then the higher the mobility of the carriers and/or their lifetimes. The collection distance measured is generally limited by the thickness of the sample under test; if the collection distance measurement exceeds about 80% of the sample thickness, then the measured value is likely to be a lower limit rather than the actual value.

The collection distances referred to in this specification were determined by the following procedure:

1) Ohmic spot contacts are placed on either side of the layer under test. This layer is typically 300-700 µm thick and 5-10 mm square, allowing spot contacts of 2-6 mm diameter. Formation of ohmic contacts (rather than contacts showing diode behaviour) is important for a reliable measurement. This can be achieved in several ways but typically the procedure is as follows:
   i) the surface of the diamond is oxygen terminated, using for example, an oxygen plasma ash, minimising the surface electrical conduction (reducing the 'dark current' of the device);
   ii) a metallisation consisting of first a carbide former (e.g. Ti, Cr) and then a thicker layer of protective material, typically Au (to which a wire bond can be made), is deposited onto the diamond by sputtering, evaporation or similar method. The contact is then typically annealed between 400-600° C. for up to about an hour.
2) Wire bonds to the contacts are made, and the diamond connected in a circuit, with a bias voltage of typically 2-10 kV/cm. The 'dark current' or leakage current is characterised, and in a good sample should be less than 5 nA, and more typically less than 100 pA at 2.5 kV/cm, using 3 mm diameter spot contacts.
3) The collection distance measurement is made by exposing the sample to beta radiation, with a Si trigger detector on the exit face to a) indicate that an event has occurred, and b) ensure that the beta particle was not stopped within the diamond film which would result in a much larger number of charge carriers being formed. The signal from the diamond is then read by a high gain charge amplifier, and, based on the known formation rate of charge carriers of about 36 electron/hole pairs per linear µm traversed by the beta particle, the collection distance can be calculated from the charge measured by the equation:

$CCD = CCE \times t$ where t=sample thickness
   CCE=charge collection efficiency=charge collected/total charge generated.
   CCD=charge collection distance.
4) For completeness, the collection distance is measured for a range of values of applied bias voltage, both forward and reverse, and the characteristic collection distance quoted at bias voltages of 10 kV/cm only for samples which show a well behaved linear behaviour for bias voltages up to 10 kV/cm bias. In addition, the entire measurement procedure is repeated several times to ensure repeatability of behaviour, as values measured on poorer samples can degrade with time and treatment history.
5) A further issue in measurement of the collection distance is whether the material is in the pumped or unpumped state. 'Pumping' (also called 'priming') the material comprises of exposing it to certain types of radiation (beta, gamma etc.) for a sufficient period, when the collection distance measured can rise, typically by a factor of 1.6 in polycrystalline CVD diamond although this can vary. The effect of priming is generally lower in high purity single crystal; priming by factors of 1.05-1.2 is common with no measurable priming in some samples. De-pumping can be achieved by exposing to sufficiently strong white light or light of selected wavelengths, and the process is believed to be wholly reversible. The collection distances referred to in this specification are all in the unpumped state whatever the final application of the material. In certain applications (e.g. high energy particle physics experiments), the increase in collection distance associated with pumping can be used beneficially to enhance the detectability of individual events, by shielding the detector from any de-pumping radiation. In other applications, the instability in device gain associated with pumping is severely deleterious.

d) Electron Mobility

The single crystal CVD diamond of the invention also has a high electron mobility ($\mu_e$) and more particularly, an electron mobility measured at 300 K greater than 2400 cm$^2$ V$^{-1}$ s$^{-1}$, and preferably greater than 3000 cm$^2$ V$^{-1}$ s$^{-1}$, and more preferably greater than 4000 cm$^2$ V$^{-1}$ s$^{-1}$. In high quality type IIa natural diamond electron mobilities at 300 K are reported typically to be 1800 cm$^2$ V$^{-1}$ s$^{-1}$ with exceptional values reported up to 2200 cm$^2$ V$^{-1}$ s$^{-1}$.

e) Hole Mobility

The single crystal CVD diamond of the invention also has a high hole mobility ($\mu_h$) and more particularly, a hole mobility measured at 300 K greater than 2100 cm$^2$ V$^{-1}$ s$^{-1}$, and preferably greater than 2500 cm$^2$ V$^{-1}$ s$^{-1}$, and more preferably greater than 3000 cm$^2$ V$^{-1}$ s$^{-1}$. In high quality type IIa natural diamond hole mobilities at 300 K are reported typically to be 1200 cm$^2$ V$^{-1}$ s$^{-1}$ with exceptional values reported up to 1900 cm$^2$ V$^{-1}$ s$^{-1}$.

The characteristics described above are observable in the majority volume of the diamond. There may be portions of the volume, generally less than 10 percent by volume, where the particular characteristic is not observable.

The single crystal CVD diamond of the invention has particular application in electronic applications and more particularly as a detector element or switching element. The high breakdown voltage in the off state of the diamond makes it particularly suitable as a component in an opto-electric switch. The use of the diamond in these applications forms another aspect of the invention.

The novel single crystal CVD diamond of the invention may be made by a method which forms yet another aspect of the invention. This method includes the steps of providing a diamond substrate having a surface which is substantially free of crystal defects, providing a source gas, dissociating the source gas and allowing homoepitaxial diamond growth on the surface which is substantially free of crystal defects in an atmosphere which contains less than 300 parts per billion nitrogen.

DESCRIPTION OF EMBODIMENTS

In addition to the characteristics described above, the single crystal CVD diamond of the invention may have one or more of the following characteristics:

1. A level of any single impurity of not greater than 5 ppm and a total impurity content of not greater than 10 ppm. Preferably the level of any impurity is not greater than 0.5 to 1 ppm and the total impurity content is not greater than 2 to 5 ppm. Impurity concentrations can be measured by secondary ion mass spectroscopy (SIMS), glow discharge mass spectroscopy (GDMS), combustion mass spectroscopy (CMS), electron paramagnetic resonance (EPR) and IR absorption, and in addition for single substitutional nitrogen by optical absorption measurements at 270 nm (calibrated against standard values obtained from samples destructively analysed by combustion analysis). In the above, "impurity" excludes hydrogen and its isotopic forms.
2. A cathodoluminescence (CL) emission signal in the 575 nm band which is low or absent, and an associated photoluminescence (PL) line, measured at 77 K under 514 nm Ar ion laser excitation (nominally 300 mW incident beam) which has a peak height $<1/1000$ of the diamond Raman peak at 1332 $cm^{-1}$. These bands are related to nitrogen/vacancy defects and their presence indicates the presence of nitrogen in the film. Due to the possible presence of competing quenching mechanisms, the normalised intensity of the 575 nm line is not a quantitative measure of nitrogen nor is its absence a definitive indication of the absence of nitrogen in the film. CL is the luminescence resulting from excitation by electron beam at a typical beam energy of 10 to 40 keV which penetrates about 30 nm to 10 microns into the sample surface. Photoluminescence is more generally excited through the sample volume.
3. i) A uniform strong free exciton (FE) peak at 235 nm in the CL spectrum collected at 77 K. The presence of a strong free exciton peak indicates the substantial absence of defects such as dislocations and impurities. The link between low defect and impurity densities and high FE has been previously reported for individual crystals in polycrystalline CVD diamond synthesis.
   ii) Strong free exciton emission in the room temperature UV-excited photoluminescence spectrum.
      Free exciton emission can also be excited by above-bandgap radiation, for example by 193 nm radiation from an ArF excimer laser. The presence of strong free exciton emission in the photoluminescence spectrum excited in this way indicates the substantial absence of dislocations and impurities. The strength of free exciton emission excited by 193 nm ArF excimer laser at room temperature is such that the quantum yield for free exciton emission is at least $10^{-5}$.
4. In electron paramagnetic resonance (EPR), a single substitutional nitrogen centre $[N-C]^0$ at a concentration <40 ppb and more typically <10 ppb indicating low levels of nitrogen incorporation.
5. In EPR, a spin density $<1\times10^{17}$ $cm^{-3}$ and more typically $<5\times10^{16}$ $cm^{-3}$ at g=2.0028. In single crystal diamond this line at g=2.0028 is related to lattice defect concentrations and is typically large in natural type IIa diamond, in CVD diamond plastically deformed through indentation, and in poor quality homoepitaxial diamond.
6. Excellent optical properties having a UV/Visible and IR (infrared) transparency close to the theoretical maximum for diamond and, more particularly, low or absent single substitutional nitrogen absorption at 270 nm in the UV, and low or absent C—H stretch bonds in the spectral range 2500 to 3400 $cm^{-1}$ wavenumbers in the IR.

The CVD diamond of the invention may be attached to a diamond substrate (whether the substrate is synthetic, natural, or CVD diamond). Advantages of this approach include providing a greater overall thickness where the thickness limits the application or providing support for a CVD diamond whose thickness has been reduced by processing. In addition, the CVD diamond of this invention may form one layer in a multilayer device, where other diamond layers may, for example, be doped to provide electrical contact or electronic junctions to the CVD diamond, or merely be present to provide support to the CVD diamond.

It is important for the production of high quality single crystal CVD diamond that growth takes place on a diamond surface which is substantially free of crystal defects. In this context, defects primarily means dislocations and microcracks, but also includes twin boundaries, point defects, low angle boundaries and any other disruption to the crystal lattice. Preferably the substrate is a low birefringence type Ia or IIb natural, Ib or IIa high pressure/high temperature synthetic diamond or a CVD synthesised single crystal diamond.

The defect density is most easily characterised by optical evaluation after using a plasma or chemical etch optimised to reveal the defects (referred to as a revealing plasma etch), using for example a brief plasma etch of the type described below. Two types of defects can be revealed:
   1) Those intrinsic to the substrate material quality. In selected natural diamond the density of these defects can be as low as 50/$mm^2$ with more typical values being $10^2$/$mm^2$, whilst in others it can be $10^6$/$mm^2$ or greater.
   2) Those resulting from polishing, including dislocation structures and microcracks in the form of 'chatter tracks' along polishing lines. The density of these can vary considerably over a sample, with typical values ranging from about $10^2$/$mm^2$, up to more than $10^4$/$mm^2$ in poorly polished regions or samples.

The preferred low density of defects is thus such that the density of surface etch features related to defects, as described above, is below $5\times10^3$/$mm^2$, and more preferably below $10^2$/$mm^2$.

The defect level at and below the substrate surface on which the CVD growth takes place may thus be minimised by careful preparation of the substrate. Here preparation includes any process applied to the material from mine recovery (in the case of natural diamond) or synthesis (in the case of synthetic material) as each stage can influence the defect density within the material at the plane which will ultimately form the substrate surface when processing to form a substrate is complete. Particular processing steps may include conventional diamond processes such as mechanical sawing, lapping and polishing, and less conventional techniques such as laser processing or ion implantation and lift off techniques, chemical/mechanical polishing, and both liquid and plasma chemical processing techniques. In addition, the surface $R_A$ (arithmetic mean of the absolute deviation of surface profile from the mean line measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50\text{-}450\times10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then the process moves directly into synthesis by the introduction of the carbon source gas. The etch time/temperature is selected to enable any remaining surface damage from processing to be removed, and for any surface contaminants to be removed, but without forming a highly roughened surface and without etching extensively along extended defects (such as dislocations) which intersect the surface and thus cause deep pits. As the etch is aggressive, it is particularly important for this stage that the chamber design and material selection for its components be such that no material from the chamber is transferred by the plasma into the gas phase or to the substrate surface. The hydrogen etch following the oxygen etch is less specific to crystal defects rounding off the angularities caused by the oxygen etch (which aggressively attacks such defects) and provides a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations by up to 50, and in some cases up to 100, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no nitrogen, i.e. less than 300 parts per billion (ppb, as a molecular fraction of the total gas volume), and preferably less than 100 parts per billion. The role of nitrogen in the synthesis of CVD diamond, particularly polycrystalline CVD diamond, has been reported in the literature. For example, it has been noted in these reports that gas phase nitrogen levels of 10 parts per million or greater modify the relative growth rates between the {100} and the {111} faces with an overall increase in growth rate, and in some cases crystal quality. Further, it has been suggested that for certain CVD diamond synthesis processes, low nitrogen contents of below a few parts per million may be used. However, none of these reported processes disclose methods of nitrogen analysis which are sufficiently sensitive to ensure that the nitrogen content is substantially below 1 part per million, and in the region of 300 or less parts per billion. Measurement of nitrogen levels of these low values requires sophisticated monitoring such as that which can be achieved, for example, by gas chromatography. An example of such a method is now described:

(1) Standard gas chromatography (GC) art consists of: A gas sample stream is extracted from the point of interest using a narrow bore sample line, optimised for maximum flow velocity and minimum dead volume, and passed through the GC sample coil before being passed to waste. The GC sample coil is a section of tube coiled up with a fixed and known volume (typically 1 cm³ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated, but the high concentration of primary gases (e.g. $H_2$, Ar) causes column saturation which makes complete separation of the nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical identity is determined by the gas residence time which is calibrated from standard gas mixtures. The response of the DID is linear over more than 5 orders of magnitude, and is calibrated by use of special calibrated gas mixtures, typically in the range of 10-100 ppm, made by gravimetric analysis and then verified by the supplier. Linearity of the DID can be verified by careful dilution experiments.

(2) This known art of gas chromatography has been further modified and developed for this application as follows: The processes being analysed here are typically operating at $50\text{-}500\times10^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut for a short duration before sample injection in order to enable the pressure at the sample coil to stabilise and be measured by a pressure gauge. To ensure a sufficient mass of sample gas is injected, the sample coil volume is enlarged to about 5 cm³. Dependent on the design of the sample line, this technique can operate effectively down to pressures of about $70\times10^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber to measure a worst case value of the nitrogen concentration within the chamber.

The source gas may be any known in the art and will contain a carbon-containing material which dissociates producing radicals or other reactive species. The gas mixture will also generally contain gases suitable to provide hydrogen or a halogen in atomic form.

The dissociation of the source gas is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount. Examples of preferred mount materials are: molybdenum, tungsten, silicon and silicon carbide. Examples of preferred reactor chamber materials are stainless steel, aluminium, copper, gold, platinum.

A high plasma power density should be used, resulting from high microwave power (typically 3-60 kW, for substrate diameters of 50-150 mm) and high gas pressures (50-500×$10^2$ Pa, and preferably 100-450×$10^2$ Pa).

Using the above conditions it has been possible to produce high quality single crystal CVD diamond layers with a value for the product of mobility and lifetime, $\mu\tau$, in excess of $1.5\times10^4$ cm$^2$/V, e.g. $320\times10^4$ cm$^2$/V for electrons and $390\times10^6$ cm$^2$/V for holes.

An example of the invention will now be described.

EXAMPLE 1

Substrates suitable for synthesising single crystal CVD diamond of the invention may be prepared as follows:
i) Selection of stock material (Ia natural stones and Ib HPHT stones) was optimised on the basis of microscopic investigation and birefringence imaging to identify substrates which were free of strain and imperfections.
ii) Laser sawing, lapping and polishing processes were used to minimise subsurface defects using a method of a revealing plasma etch to determine the defect levels being introduced by the processing.
iii) It was possible routinely to produce substrates in which the density of defects measurable after a revealing etch is dependent primarily on the material quality and is below $5\times10^3$/mm$^2$ and generally below $10^2$/mm$^2$. Substrates prepared by this process are then used for the subsequent synthesis.

A high temperature/high pressure synthetic type Ib diamond was grown in a high pressure press, and then prepared as a substrate using the method described above to minimise substrate defects. In finished form the substrate was a plate 5×5 mm square by 500 μm thick, with all faces {100}. The surface roughness at this stage was less than 1 nm $R_A$. The substrate was mounted on a tungsten substrate using a high temperature braze suitable for diamond. This was introduced into a reactor and an etch and growth cycle commenced as described above, and more particularly:

1) The reactor was pre-fitted with point of use purifiers, reducing nitrogen levels in the incoming gas stream to below 80 ppb, as determined by the modified GC method described above.
2) An in situ oxygen plasma etch was performed using 30/150/1200 sccm (standard cubic centimeter per second) of $O_2$/Ar/$H_2$ at $333\times10^2$ Pa and a substrate temperature of 800° C.
3) This moved without interruption into a hydrogen etch with the removal of the $O_2$ from the gas flow.
4) This moved into the growth process by the addition of the carbon source which in this instance was $CH_4$ flowing at 30 sccm. The growth temperature at this stage was 980° C.
5) The atmosphere in which the growth took place contained less than 100 ppb nitrogen, as determined by the modified GC method described above.
6) On completion of the growth period, the substrate was removed from the reactor and the CVD diamond layer removed from the substrate.
7) This layer was then polished flat to a 410 μm thick layer, cleaned and oxygen ashed to produce a surface terminated by O and tested for its charge collection distance. This was found to be 380 μm at an applied field of 1 V/μm (a value invariably limited by the sample thickness) giving a lower limit for the product of mobility and lifetime, $\mu\tau$, of $3.8\times10^{-6}$ cm$^2$/V.
8) The resistivity of the diamond layer, in the off state, was found to be $6\times10^{14}$ Ωcm when measured at 20° C. at an applied field of 50 V/μm.
9) The layer, identified as HDS-1, was further characterised by the data provided below and in the attached FIGS. 1 to 8:
   i) The CL spectra showing low blue band, low 575 nm and high FE emissions (FIGS. 1 and 2).
   ii) EPR spectra, showing low substitutional nitrogen and a weak g=2.0028 line (FIGS. 3 to 5).
   iii) Optical spectra showing the near theoretical transmission (FIG. 6).
   iv) X-ray rocking curves map, showing the angular spread of the sample to be less than 10 arc sec (FIG. 7).
   v) Raman spectrum showing a line width (FWHM) to be about 2 cm$^{-1}$ (FIG. 8).

EXAMPLE 2

The procedure set out in Example 1 was repeated with the following variation in conditions:
Ar 75 sccm, $H_2$ 600 sccm, $CH_4$ 30 sccm, 820° C., 7.2 kW, less than 200 ppb nitrogen, as measured by the modified GC method described above.

The CVD diamond layer produced was processed to a layer 390 μm thick for testing. The $\mu\tau$ product was found to be $320\times10^{-6}$ cm$^2$/V for electrons and $390\times10^{-6}$ cm$^2$/V for holes (measured at 300 K), giving a mean value of $355\times10^{-6}$ cm$^2$/V.

EXAMPLE 3

The procedure set out in Example 1 was further repeated with the following variation in conditions:
Ar 150 sccm, $H_2$ 1200 sccm, $CH_4$ 30 sccm, $237\times10^2$ Pa and a substrate temperature of 822° C., less than 100 ppb nitrogen, as measured by the modified GC method described above.

The CVD diamond layer produced was processed to a layer 420 μm thick for testing. The collection distance of the layer was measured to be >400 μm. The resistivity the layer at an applied field of 50V/μm exceeded $1\times10^{14}$ Ωcm.

EXAMPLE 4

The procedure set out in Example 1 was further repeated with the following variations in conditions:
The oxygen plasma etch used 15/75/600 sccm of $O_2$/Ar/$H_2$. This was followed by a hydrogen etch using 75/600 sccm Ar/$H_2$. Growth was initiated by the addition of the carbon source which in this instance was $CH_4$ flowing at 30 sccm. The growth temperature at this stage was 780° C.

The CVD diamond layer produced had a thickness of 1500 μm, and was processed into a layer 500 μm thick for testing.
1) The charge collection distance was found to be 480 μm at an applied field of 1 V/μm and 300 K, (a value limited by the sample thickness) giving a lower limit to the product of mobility and lifetime, μτ, $4.8 \times 10^{-6}$ $cm^2/V$.
2) The μτ product measured at 300 K using the Hecht relationship, as described above, was $1.7 \times 10^{-3}$ $cm^2/V$ and $7.2 \times 10^{-4}$ $cm^2/V$ for electrons and holes respectively.
3) A space charge limited time of flight experiment measured the electron mobility, $\mu_e$ to be 4400 $cm^2/Vs$ at a sample temperature of 300 K.
4) A space charge limited time of flight experiment measured $\mu_h$, the hole mobility, to be 3800 $cm^2/Vs$ at a sample temperature of 300 K.
5) SIMS measurements showed that there is no evidence for any single defect present in concentrations above $5 \times 10^{16}$ $cm^{-3}$ (excluding H and its isotopes).
6) The measured resistivity was in excess of $5 \times 10^{14}$ Ωcm at an applied voltage of 100 V/μm as measured at 300 K.
7) The PL spectrum showed low blue band and low 575 nm intensity (<1/1000 of Raman peak). The Raman FWHM line width was 1.5 $cm^{-1}$. The CL spectrum showed a strong FE peak.
8) EPR spectra showed no (<7 ppb) substitutional nitrogen, and no (<10 ppb) g=2.0028 line.

FURTHER EXAMPLES

The procedure set out in Example 4 was repeated several times to produce free standing high quality high purity single crystal CVD layers with thicknesses ranging from 50-3200 μm.

Various properties of the diamond were measured (at 300 K) and the results thereof are set out in the table. The dielectric breakdown voltage of the samples exceeded 100 V/μm.

| Example (Sample ID) | Plate Thickness (μm) | CCD (μm) | $\mu_e\tau_e$ ($cm^2/V$) |
|---|---|---|---|
| Ex 1 (HDS-1) | 410 | >380* | |
| Ex 2 | 390 | | $3.2 \times 10^{-4}$ |
| Ex 3 | 420 | >400* | |
| Ex 4 | 500 | >480* | $1.7 \times 10^{-3}$ |
| EX 5 | 700 | >650* | $1.7 \times 10^{-3}$ |
| EX 6 | 1 000 | | $3.3 \times 10^{-3}$ |

| Example (Sample ID) | $\mu_h\tau_h$ ($cm^2/V$) | $\mu_e$ ($cm^2/Vs$) | $\mu_h$ ($cm^2/Vs$) | Resistivity (Ω cm) at 50 V/μm |
|---|---|---|---|---|
| Ex 1 (HDS-1) | | | | $6 \times 10^{14}$ |
| Ex 2 | $3.9 \times 10^{-4}$ | | | |
| Ex 3 | | | | $>1 \times 10^{14}$ |
| Ex 4 | $7.2 \times 10^{-4}$ | 4 400 | 3 800 | $>5 \times 10^{14}$ |
| Ex 5 | $6.5 \times 10^{-4}$ | 3 900 | 3 800 | $>1 \times 10^{14}$ |
| Ex 6 | $1.4 \times 10^{-3}$ | 4 000 | 3 800 | $>5 \times 10^{12}$ |

*Minimum value, limited by sample thickness

BRIEF DESCRIPTION OF FIGURES

FIG. 3: Room temperature EPR spectra of (1) homoepitaxial CVD diamond containing approximately 0.6 ppm of single substitutional nitrogen and (2) HDS-1. The spectra were measured under the same conditions and the samples were approximately the same size.

FIG. 4: EPR spectra recorded at 4.2 K of (i) high purity homoepitaxial CVD diamond grown simultaneously with HDS-1 which was plastically deformed after growth to demonstrate the influence on the EPR signal of structural defects created by indentation and (ii) HDS-1. The spectra were measured under the same conditions.

Figure 1:
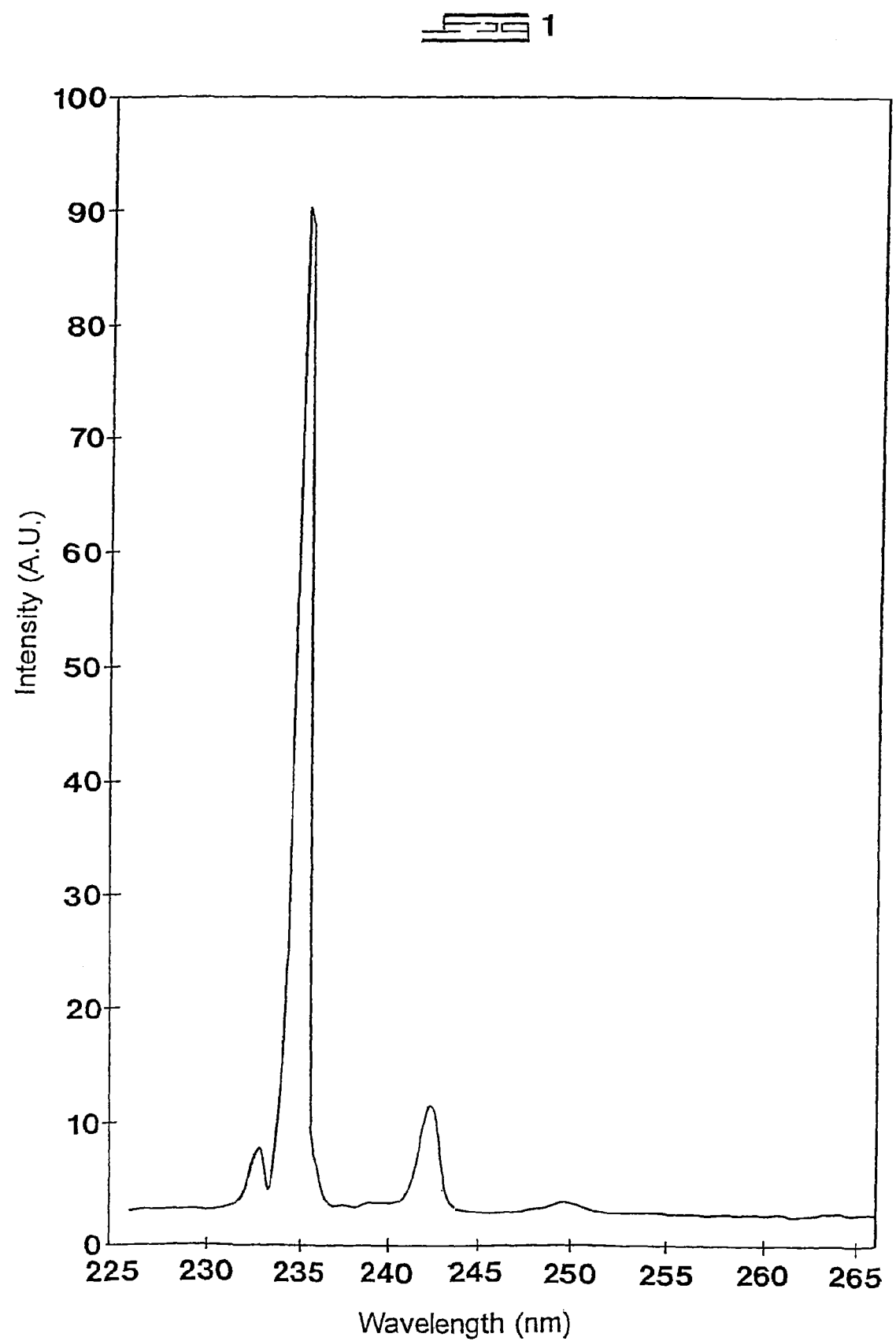
FIG. 1: Free exciton cathodoluminescence spectrum of HDS-1 at 77 K, showing strong emission at 235 nm (transverse optic mode).
Figure 2:
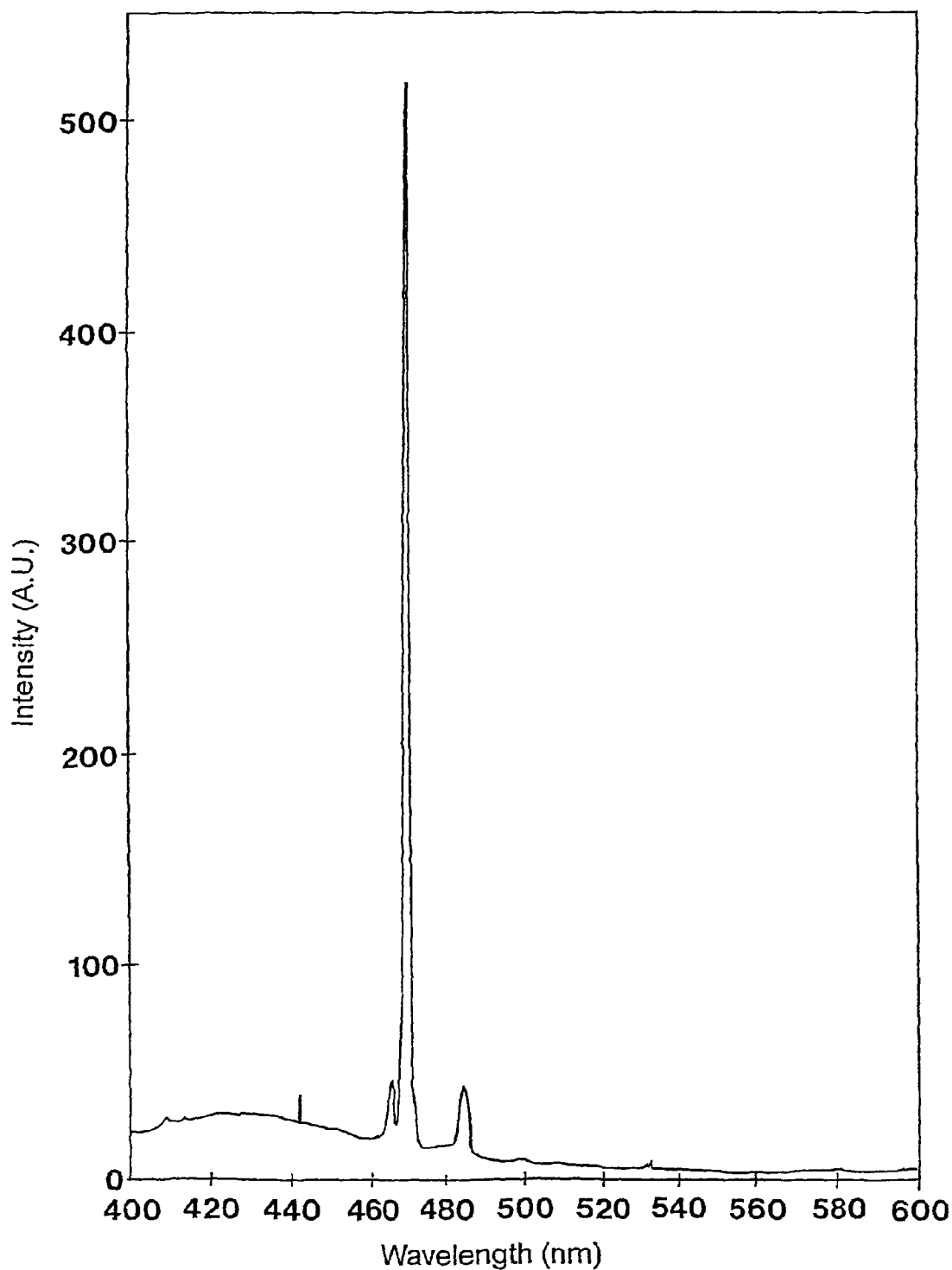
FIG. 2: Cathodoluminescence spectrum (77 K) of HDS-1, showing a broad weak band centred at approximately 420 nm, very weak lines at 533 nm and 575 nm and very intense free exciton emission (shown in second order at 470 nm).
Figure 5:
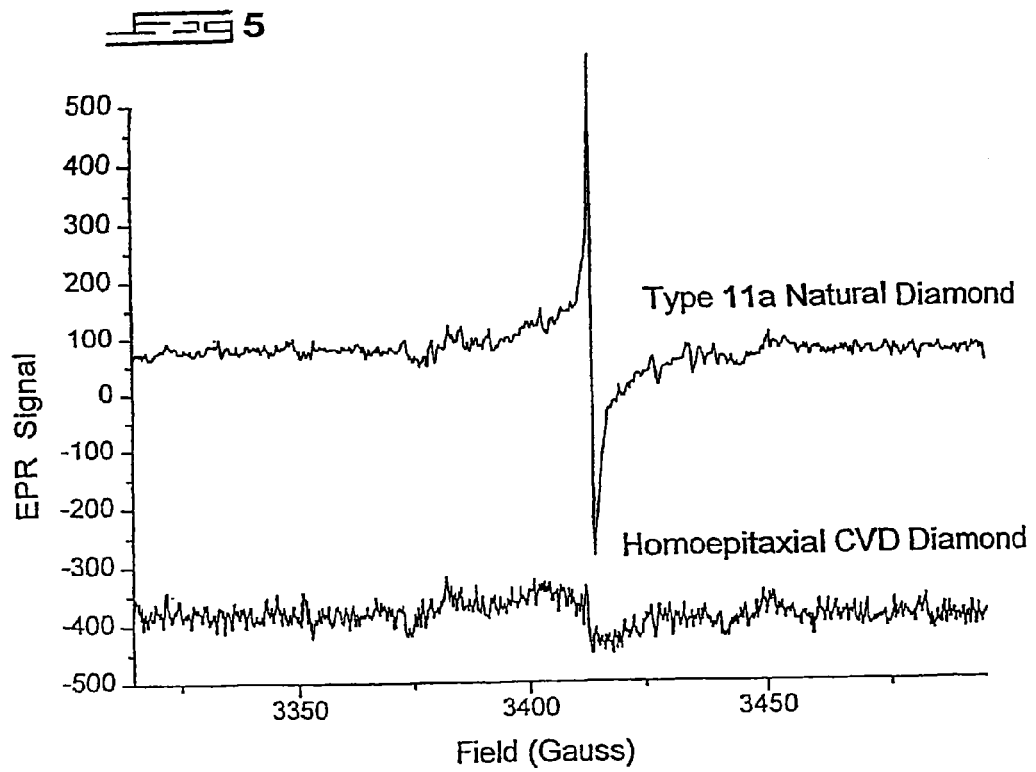
FIG. 5: Room temperature EPR spectra of type IIa natural diamond and HDS-1. The spectra were measured under the same conditions and the samples were of the same size.
Figure 6:
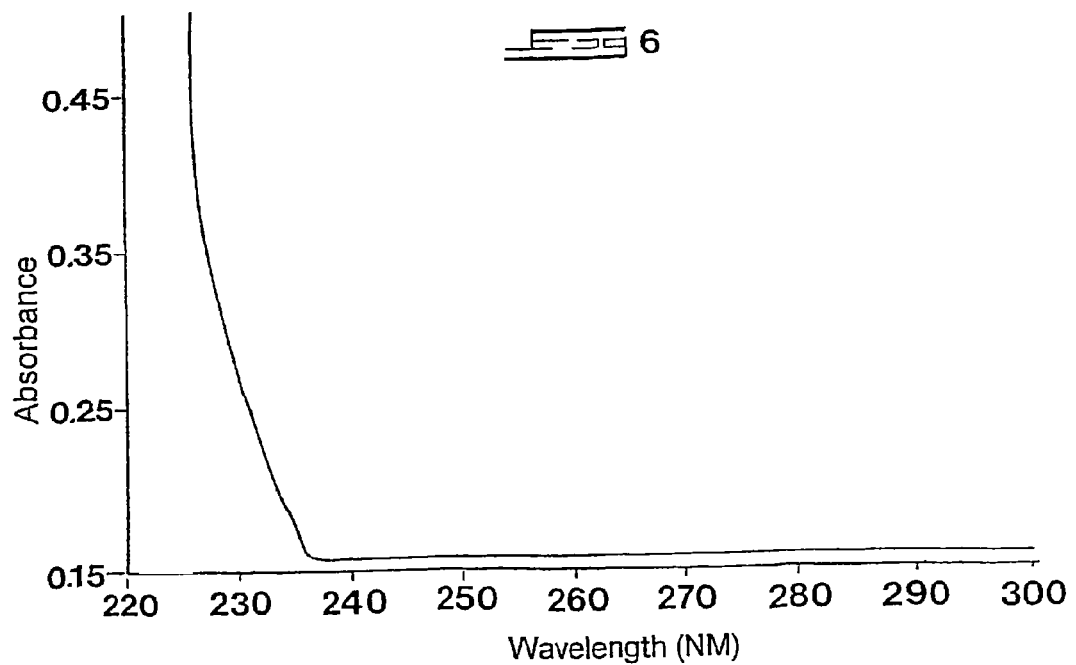
FIG. 6: Room temperature ultraviolet absorption spectrum of HDS-1, showing the intrinsic absorption edge and the absence of the absorption band centred at 270 nm attributed to single substitutional nitrogen.
Figure 7:
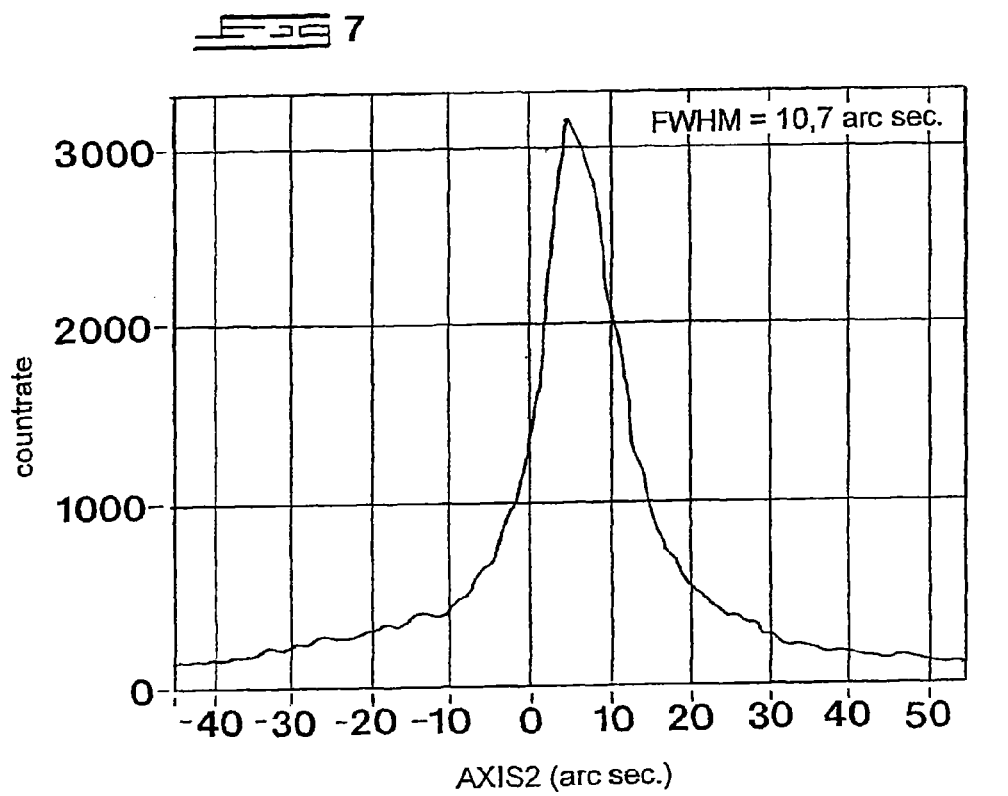
FIG. 7: Double axis X-ray rocking curve of HDS-1.
Figure 8:
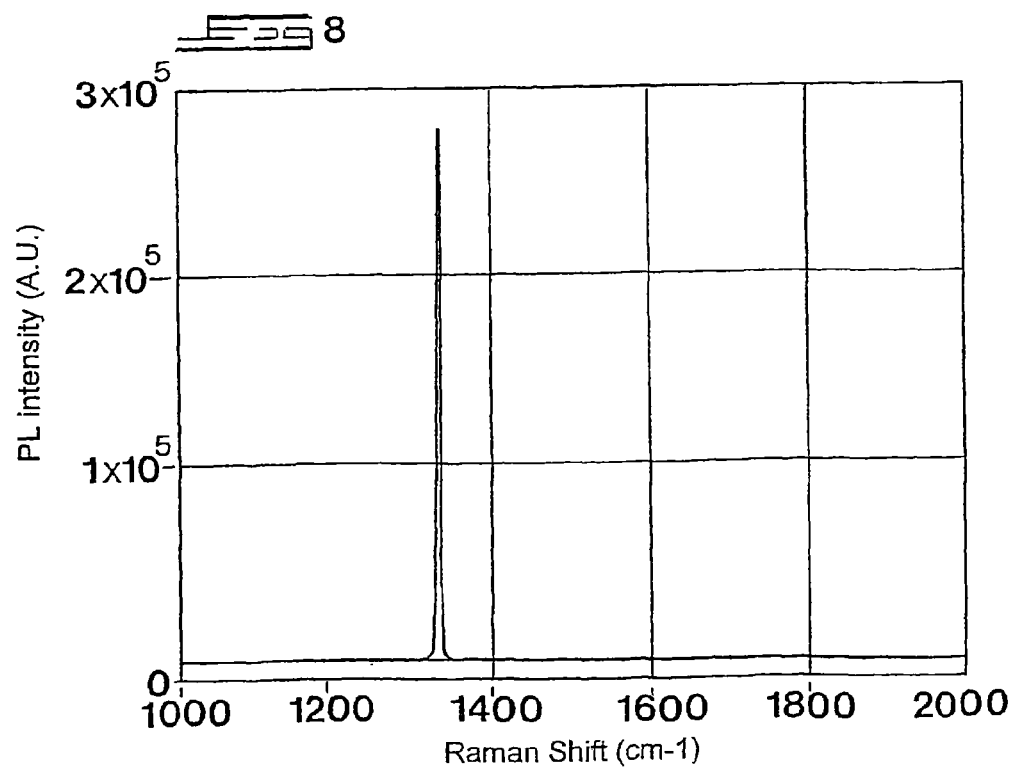
FIG. 8: Raman spectrum of HDS-1 measured at 300 K using the 488 nm line of an argon ion laser.

The invention claimed is:

1. A single crystal diamond prepared by CVD and having at least one of the following characteristics:
   (i) in the off state, a resistivity $R_1$ greater than $1 \times 10^{12}$ Ωcm at an applied field of 50 V/μm measured at 300 K;
   (ii) a μτ product measured at 300 K greater than $1.5 \times 10^{-6}$ $cm^2$ $V^{-1}$ where, μ is the mobility and τ is the lifetime of the charge carriers;
   (iii) an electron mobility ($\mu_e$) measured at 300K greater than 2400 $cm^2$ $V^{-1}$ $s^{-1}$;
   (iv) a hole mobility ($\mu_h$) measured at 300K greater than 2100 $cm^2$ $V^{-1}$ $s^{-1}$; and
   (v) a high charge collection distance greater than 150 μm measured at an applied field of 1 V/μm and 300 K.

2. A single crystal diamond according to claim 1 which has resistivity greater than $2 \times 10^{13}$ Ωcm at an applied field of 50 V/μm measured at 300 K.

3. A single crystal diamond according to claim 1 which has a resistivity $R_1$ greater than $5 \times 10^{14}$ Ωcm at an applied field of 50 V/μm measured at 300 K.

4. A single crystal diamond according to claim 1 which has a μτ product measured at 300 K greater than $1.5 \times 10^{-6}$ $cm^2$ $V^{-1}$ where, μ is the mobility and τ is the lifetime of the charge carriers.

5. A single crystal diamond according to claim 4 which has a μτ product measured at 300 K of greater than $4.0 \times 10^{-6}$ $cm^2$ $V^{-1}$.

6. A single diamond according to claim 4 which has a μτ product measured at 300 K greater than $6.0 \times 10^{-6}$ $cm^2$ $V^{-1}$.

7. A single crystal diamond according to claim 1 which has an electron mobility ($\mu_e$) measured at 300 K greater than 3000 $cm^2$ $V^{-1}$ $s^{-1}$.

8. A single crystal diamond according to claim 7 which has an electron mobility ($\mu_e$) measured at 300 K greater than 4000 $cm^2$ $V^{-1}$ $s^{-1}$.

9. A single crystal diamond according to claim 1 which has a hole mobility measured at 300 K greater than 2500 $cm^2$ $V^{-1}$ $s^{-1}$.

10. A single crystal diamond according to claim 9 which has a hole mobility measured at 300 K greater than 3000 $cm^2$ $V^{-1}$ $s^{-1}$.

11. A single crystal diamond according to claim 1 which has a charge collection distance measured at 300 K greater than 400 μm.

12. A single crystal diamond according to claim 11 which has a charge collection distance measured at 300 K greater than 600 μm.

13. A single crystal diamond according to claim 1 which has each of the characteristics (i), (ii), (iii), (iv) and (v).

14. A method of producing a single crystal diamond according to claim 1 which includes the steps of providing a diamond substrate having a surface which is substantially free of crystal defects, providing a source gas, dissociating the source gas and allowing homoepitaxial diamond growth on the surface which is substantially free of crystal defects in an atmosphere which contains less than 300 parts per billion nitrogen.

15. A method according to claim 14 wherein the substrate is a low birefringence type Ia or IIb natural, Ib or IIa high pressure/high temperature synthetic diamond.

16. A method according to claim 14 wherein the substrate is a CVD synthesized single crystal diamond.

17. A method according to claim 14 wherein the surface on which diamond growth occurs has a density of surface etch features related to defects below $5 \times 10^3/mm^2$.

18. A method according to claim 14 wherein the surface on which diamond growth occurs has a density of surface etch features related to defects below $10^2/mm^2$.

19. A method according to claim 14 wherein the surface on which the diamond growth occurs is subjected to a plasma etch to minimise surface damage of the surface prior to diamond growth.

20. A method according to claim 19 wherein the plasma etch is an in situ etch.

21. A method according to claim 19 wherein the plasma etch is an oxygen etch using an etching gas containing hydrogen and oxygen.

22. A method according to claim 21 wherein the oxygen etch conditions are a pressure of 50 to $450 \times 10^2$ Pa, an etching gas containing an oxygen content of 1 to 4%, an argon content of up to 30% and the balance hydrogen, all percentages being by volume, a substrate temperature of 600 to 1100° C., and an etch duration of 3 to 60 minutes.

23. A method according to claim 19 wherein the plasma etch is a hydrogen etch.

24. A method according to claim 23 wherein the hydrogen etch conditions are a pressure of 50 to $450 \times 10^2$ Pa, an etching gag containing hydrogen and up to 30% by volume argon, a substrate temperature of 600 to 1100° C. and an etch duration of 3 to 60 minutes.

25. A method according to claim 19 wherein the surface on which the diamond growth occurs is subjected to both an oxygen and a hydrogen etch to minimise surface damage of the surface prior to diamond growth.

26. A method according to claim 25 wherein the oxygen etch is followed by a hydrogen etch.

27. A method according to claim 19 wherein the surface $R_A$ of the surface on which the diamond growth occurs is less than 10 nanometers prior to that surface being subjected to the plasma etching.

28. A method according to claim 14 wherein the diamond growth takes place in an atmosphere which contains less than 100 ppb nitrogen.

29. A method according to claim 14 wherein the surface on which diamond growth occurs is substantially a {100}, {110}, {113} or {111} surface.

30. A method according to claim 14 wherein the dissociation of the source of the source gas occurs using microwave energy.

31. An electronic element comprising a single crystal diamond according to claim 1.

32. An optic-electric switch comprising a single crystal diamond of claim 1 as a component.

33. A detector element or switching element comprising a single crystal diamond according to claim 1.

\* \* \* \* \*